United States Patent [19]

Muzyczko et al.

[11] 3,969,119

[45] July 13, 1976

[54] PHOTOREACTIVE COMPOSITIONS COMPRISING POLYMERS CONTAINING ALKOXYAROMATICGLYOXY GROUPS

[75] Inventors: Thaddeus M. Muzyczko, Downers Grove; Thomas H. Jones, Naperville, both of Ill.

[73] Assignee: The Richardson Company, Des Plaines, Ill.

[22] Filed: June 9, 1975

[21] Appl. No.: 585,215

Related U.S. Application Data

[62] Division of Ser. No. 267,475, June 29, 1972, Pat. No. 3,888,671.

[52] U.S. Cl............................... 96/115 R; 96/115 P; 96/86 P; 204/159.14
[51] Int. Cl.²............................................ G03C 1/68
[58] Field of Search................ 96/115 R, 115 P, 33, 96/86 P; 101/456; 204/159.14, 159.15, 159.19, 159.22; 260/31.6, 31.4

[56] References Cited

UNITED STATES PATENTS

| | | | |
|---|---|---|---|
| 2,824,084 | 2/1958 | Unruh et al. | 96/115 R |
| 2,824,087 | 2/1958 | Sagura et al. | 96/115 R |
| 3,475,176 | 10/1969 | Rauner | 96/115 R |
| 3,556,792 | 1/1971 | Katz | 96/115 R |
| 3,556,793 | 1/1971 | Field et al. | 96/115 R |

*Primary Examiner*—Edward C. Kimlin
*Attorney, Agent, or Firm*—Alan M. Abrams

[57] ABSTRACT

A photoreactive composition containing an effective amount of a compound having at least two alkoxyaromaticglyoxy substituents per molecule, which substituents have the following general formula:

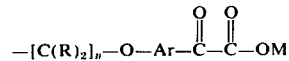

wherein R is selected from the class consisting of H, aryl, alkyl, halo and arakyl having up to 10 carbon atoms, n is an integer from 1 to 18, Ar is an aromatic substituent, and M is selected from the class consisting of H, alkali metal, ammonium, and substituted ammonium. These compositions are useful in a wide variety of photochemical and photomechanical processes and are particularly suited for use as photopolymers, photoinitiators and photosensitizers in light sensitive coatings of presensitized lithographic plates.

18 Claims, No Drawings

PHOTOREACTIVE COMPOSITIONS COMPRISING POLYMERS CONTAINING ALKOXYAROMATICGLYOXY GROUPS

This is a division of application Ser. No. 267,475, now U.S. Pat. No. 3,888,671, filed June 29, 1972.

This invention generally relates to novel photosensitive compositions which are useful in a wide variety of photochemical processes such as, for example, planographic, letterpress, gravure and silk screen printing processes as well as photomechanical processes such as, for example, the production of printed circuits, chemical milling and chemical etching. An important aspect of the present invention is directed to novel photoreactive compositions which are especially suitable for use as photopolymers, photoinitiators and photosensitizers in light sensitive coatings used in lithographic plates.

In commercial lithography, a light sensitive coating on a backing member is generally subjected to a controlled light exposure and thereafter developed to provide an image area which is insoluble in a particular solvent and a nonimage area which is soluble in that solvent. Typically, the image area is grease-receptive and water repellent, while the non-image area is water-receptive and grease-repellent. Oil-based inks therefore adhere only to the image area, from which they can be transferred to a surface in a suitable printing operation such as, for example, by offset printing.

Early lithographic plates typically had light sensitive surface coatings which generally contained bichromated colloids such as bichromated albumin that underwent a sol-gel transformation upon being subjected to light. Since these bichromated colloids are sensitive to moisture, they deteriorate rapidly on being subjected to atmospheric conditions and their use has been generally limited to so-called wipe-on plates, that is, systems wherein the light sensitive bichromated coating is applied to the plate or backing member immediately prior to its being exposed to light.

Subsequently, light sensitive diazo compounds have been used as the light sensitive coating in presensitized lithographic plates, namely, plates which have the light sensitized diazo coating applied thereto prior to actual use. While diazo-sensitized plates are extensively commercially used at this time, they are characterized by certain disadvantages which include, for example, limited shelf life, and the need for a barrier coating between the diazo coating and the backing member. In addition, the diazo coatings present handling problems by reason of their sensitivity to heat, moisture and tungsten light.

More recently, the efforts to overcome the disadvantages of the above mentioned prior art compositions have involved the use of photopolymer coatings which can be applied to a suitable backing member long prior to actual use and which, upon being subjected to light, become insolubilized by polymerization or crosslinking. These photopolymer coatings have been composed of various materials, for example, the cinnamic ester resins of polyvinyl alcohol and cellulose as well as those based on epoxy resins. Similarly, acrylic coatings and polyamide coatings are other types of photopolymerizable coatings which have been discussed in the prior art. These known photopolymer coatings, however, often require the addition of photosensitizers and photoinitiators. Also, when used in lithographic plates, these known photopolymer coatings have presented relatively difficult manufacturing problems and have required development procedures which are more complex than desired.

It is, therefore, an important object of the present invention to provide a new class of photosensitive compositions characterized by improved photoreactive properties enabling them to be used in a wide variety of photochemical and photomechanical processes.

Another object of the present invention is to provide a new and useful class of photoreactive compositions which are useful in virtually all printing processes including planographic, relief, gravure and silk screen printing processes.

Another object of the present invention is to provide a new and useful class of photoreactive compositions which can be used alone, or if desired, in conjunction with a wide variety of resins, both saturated and unsaturated, to provide improved photoreactive coatings.

Another object of the present invention is to provide a class of novel photoreactive compositions which include an effective amount of a multi-functional alkoxyaromaticglyoxy substituents.

Another object of the present invention is to provide a class of photoreactive polymeric compositions advantageously suitable for use as photoinitiators, photosensitizers or photopolymers, which compositions include, as a repeated structure, a plurality of alkoxyaromaticglyoxy groups, either as pendant groups or as a part of the polymeric chain.

Another object of the present invention is to provide a class of photoreactive compositions suitable for use as photoinitiators, photosensitizers, and photopolymers characterized by long shelf life, enabling them to be particularly suitable for use in presensitized lithographic plates.

Another object of the present invention is to provide a class of photoreactive composition which can be used alone or in conjunction with a wide variety of resins, to provide photoreactive coatings which are developable with water or alcohol based solvents or desensitizers.

Another object of the present invention is to provide a class of improved photoreactive compositions which, upon controlled exposure to actinic light, are capable of forming insoluble image areas that exhibit long running characteristics on backing members in lithographic plates.

Another object of the present invention is to provide a class of improved photoreactive compositions which can be used in ink and coating formulations to make such ink and coating formulations photocurable.

These and other objects of the present invention will be apparent to those skilled in the art from reading the following more detailed description.

In accordance with an important aspect of the present invention, novel compounds are provided which are soluble in a suitable solvent, typically an aqueous solvent or an organic solvent such as acetone or methylethyl ketone. These novel compounds, upon exposure to actinic light, photoreact and become insoluble. As such, the compounds of this invention are particularly suitable for use in photoreactive processes including photochemical as well as photomechanical processes and find advantageous use either alone, or in conjunction with other materials, in photoreactive coatings used on lithographic plates.

The novel compositions of this invention can be generally characterized as multi-functional alkoxyaromaticglyoxy substituted compounds having at least two alkoxyaromaticglyoxy substituents per molecule which substituents have the following general formula:

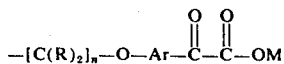

wherein R is selected from the class consisting of H, aryl, alkyl, halo and arakyl having up to 10 carbon atoms, n is an integer from 1 to 18, Ar is an aromatic substituent and M is selected from the class consisting of H, alkali metal, ammonium and substituted ammonium.

In the above formula, the aryl substituent referred to in the definition of the R group is derived from an aromatic hydrocarbon by the removal of a hydrogen atom and includes, for example; phenyl, tolyl, and the like. The alkyl substituent referred to in the definition of the R group has up to 10 carbon atoms. In the preferred embodiment R is hydrogen. The preferred alkali metals in the M group are sodium, potassium and lithium. Correspondingly, the substituted ammonium substituents encompassed by the definition of the M group are those which provide a compound which is water soluble and include, for example, triethylamine, ethylamine, aniline, substituted aniline (e.g. chloroaniline, cyanoaniline and methyoxyaniline), pyridine, substituted pyridine (e.g. picoline and 2,6-lutidine), the alkanolamines such as, for example, mono, di and tri-alkanolamines wherein the alkanol group is ethanol or isopropanol, the alkylamines such as, for example, the mono, di and tri-alkylamines wherein the alkyl group is ethyl or propyl, morpholine and the cycloaliphatic amines such as, for example, cyclohexylamine.

As used herein, in referring to the alkyloxyaromaticglyoxy substituent, the "Ar" group is intended to include all structures exhibiting aromaticity, including: carbon ring structures such as, for example, phenyl, diphenyl and the like; fused ring structures such as, for example, derivatives of naphthalene, anthracene, phenanthrene, and the like; and heterocyclic structures such as, for example, derivatives of pyridine, furan, thiophene, pyrrole, quinoline, indole, and the like. In the preferred embodiment of this invention, however, the "Ar" group is phenyl.

The alkoxyaromaticglyoxy substituted compounds of the present invention include a backbone structure, the chemical nature of which is not critical except in its ability to bondably connect with at least two alkoxyaromaticglyoxy substituents. As such, these backbone structures can be organic, organo-metallic or inorganic and be in monomeric, oligomeric or polymeric form with the organic oligomeric and polymeric backbone structures being preferred. In this regard, it should be noted that the term polymeric is used to include homopolymers and copolymers which are characterized by two or more dissimilar monomeric units and are produced by polymerization, condensation or addition. These copolymers can be in graft, random or alternating form. Examples of suitable backbones include: the aliphatics such as methylene, ethylene and propylene; the aromatics such as phenylene, biphenylene, naphthalene and anthracene; the substituted aromatics such as tolylene, ethylphenylene, aminophenylene, alkoxyphenylenes (e.g. methoxyphenylene), cyanophenylene, hydroxyphenylene, the halophenylenes (e.g. chlorophenylene), ethylnaphthalene, carboxyphenylene, difunctional derivatives of the phthalates and substituted phthalates such as the hydroxy alkylphthalate compounds (e.g. hydroxyethylphthalate) and acyloxyphenylenes (e.g. acetoxyphenylene); cyclic hydrocarbons such as difunctional derivatives of cyclopentane and cyclohexane; heterocyclics such as difunctional derivatives of thiophene and pyrrole; the organometallics such as difunctional derivatives of the metallocenes such as, for example, ferrocene; polymeric materials such as the polyalkylenes (e.g. polyethylene, polypropylene and polybutylene); polyesters such as polyethyleneterephthalate and polyethyleneadipate; polyurethanes such as the toluene diisocyanate polyol urethanes; polyamides such as polyhexamethyleneadipamide; copolymers such as vinylidene chloride/vinyl chloride copolymers; the polysiloxanes; the polyalkyleneoxides (e.g. polyethylene oxide, polypropylene oxide, polybutylene oxide, polytetramethylene ether and polyepichlorohydrin); the polyalkylene imines such as polyethylenimine and polypropylenimine; substituted polyakylenes such as polyvinylpyrrolidone; and phenolic derivatives such as novolac, resole and polyphenylene oxide.

As previously noted, the photoreactive compositions of the present invention can be used alone or in conjunction with other materials to provide photoreactive compositions suitable in a wide variety of photomechanical and photochemical processes. For example, these novel compositions exhibit advantageous utility as photoinitiators with both saturated and unsaturated resins including resins which are not photosensitive in themselves. In particular, durable insoluble photoreaction products have been formed through the conjoint use of the photoreactive compositions of the present invention as photosensitizers with a wide variety of resins, including: the acrylic polymers and acrylic ester resins such as polymethylmethacrylate, polyethylmethacrylate, and copolymers of methyl and butyl methacrylate (e.g. "Elvacite"); polyurethane resins such as those formed by reacting diisocyanates such as, for example, toluene diisocyanate with low molecular weight polyesters or low molecular weight polyethylene glycols (e.g. "Estane" polyurethane resins); blocked urethane resins such as, for example, phenol blocked polyurethane resins (e.g. "Tranco 3A" blocked urethane resins); alkyl celluloses such as ethyl cellulose (e.g. "Hercules K-type" ethyl cellulose); epoxy resins (e.g. "Epon 1004" which is the condensation product formed from bisphenol A and epichlorohydrin); phenoxy resins (e.g. "Bakelite PKHH" phenoxy resin); vinyl acetate/vinyl chloride copolymers (e.g. "Bakelite VYHH" an 86% vinyl chloride, 14% vinyl acetate copolymer medium molecular weight resin); vinyl modified polyethylene such as ethylene/vinyl acetate copolymer containing 2 to 50% vinyl acetate ("Ultrathene" ethylene/vinyl acetate copolymer); partially (5 to 80%) hydrolyzed vinyl acetate resin (e.g. "Bakelite" MA 28-18 18% hydrolyzed vinyl acetate); phenolic resins (e.g. "Plenco 1000" novolac resin); acrylamide and modified acrylamide polymers such as diacetone acrylamide homopolymer, N-methylol acrylamide, N-alkoxymethyl acrylamide and partially hydrolyzed acrylamide; water soluble cellulose derivatives such as the alkoxylated celluloses and hydroxypropyl cellulose (e.g. "Klucel" hydroxypropyl cellulose); and water-soluble polyether resins such as the polyalkylene oxides (e.g. "Polyox WSRN-80" polyethylene oxide).

The amount of the alkoxyaromaticglyoxy substituted compounds of the present invention which will be used in a given photoreactive composition will vary over a broad range depending upon the intended function of the compound in the composition. For this reason, the concentration of these constituents in a given photoreactive composition is best described as an "effective amount" and ranges from 0.01% to 100% based on the total weight of reactive material in the composition. For example, when these alkoxyaromaticglyoxy substituted compounds are used as photoinitiators in a particular coating composition which includes polymerizable monomers (for example, acrylic or vinyl monomers), the amounts of these compounds will generally range from approximately 0.01% to 10% by weight, based on the total weight of reactive material in the composition. When used as a photopolymer with other resins, whether saturated or unsaturated, however, the amounts of the alkoxyaromaticglyoxy substituted compounds of the present invention can be as low as 5% by weight and still provide a satisfactory photoreactive coating which, upon being subjected to actinic radiation, forms an insoluble species. Correspondingly, the novel compounds of the present invention can be used alone, that is, without any other thermoplastic resin, to provide a photoreactive coating composition which can be advantageously employed in virtually all photochemical and photomechanical processes including, in particular, the manufacture of presensitized lithographic plates.

In those embodiments of the present invention wherein the alkoxyaromaticglyoxy groups are present as pendant groups or part of a polymeric chain, the degree of substitution of these glyoxy substituents can best be described as an amount sufficient to provide the polymer with the ability to form an insoluble species upon being subjected to light. Since the acid form of these compounds is preferred in applications wherein these compounds are applied as a solution to a backing or support member, the minimum degree of substitution which is preferred with such embodiments is that amount which will provide an overall composition soluble in the solvent used in such solution. In this regard, the preferred minimum degree of substitution of the acid form of the alkoxyaromaticglyoxy substituents on a polymeric backbone is that amount which provides an overall compound which is soluble in an aqueous alkaline solution.

If desired, other known photoinitiators may be used in photoreactive coatings which include these alkoxyaromaticglyoxy substituted compounds. Examples of such other photoinitiators which may be employed include benzoin, benzoin methyl ether, alpha-methylbenzoin, alpha-allylbenzoin, biacetyl, benzophenone, benzaldehyde, and acetophenone.

As previously indicated, the novel compounds of the present invention can also function as sensitizers, that is, they exhibit a property of absorbing light and transferring energy to the photosensitive material associated therewith to provide increased photosensitivity in a given photosensitive or photoreactive composition. As such, these photosensitizers can be used alone or in conjunction with other known sensitizers. Examples of additional sensitizing agents which can be used in conjunction with these novel compounds include Michler's ketone, picric acid, 2,4,6, trinitrobenzoic acid, 1,2 benzanthraquinone, 2,5 diphenyl-p-quinone, 4,4 tetraethyl diamino diphenyl ketone, 4,4'tetraethyl diamino- diphenyl carbinol, 4,4 tetramethyl diamino benzophenone imide, 1-methyl-2 benzoylmethylene-beta-naphthothiazoline, 4,4 diazodistilbene-2,2' disulfonic acid, and auramine base. other sensitizers exhibiting similar properties and characteristics which may be used in conjunction with the photosensitizers of the present invention will be apparent to those skilled in this art. In this regard, it should be noted that the photoreactive coating compositions of the present invention do not require the addition of other sensitizers such as those identified above in order to exhibit satisfactory sensitivity.

In general, it has been found that when the photoreactive materials of the present invention are used in photosensitive coatings which include a monomer such as a vinyl or acrylic monomer that an antioxidant such as, for example, 2,6-di-tert-butyl-p-cresol or p,p'-biphenol can be advantageously employed.

It has been found that the composition of the present invention is also quite stable if stored away from light, however, in certain instances it may be desirable to include a small quantity of a polymerization inhibitor, such as, for example, hydroquinone, which is sufficient to maintain the stability of the composition but insufficient to prevent, or materially affect, polymerization when the composition is later exposed to actinic light.

In preparing products made with the organic compounds of the present invention, such as for example, lithographic plates, a solution of these novel alkoxyaromaticglyoxy substituted molecules alone, or in conjunction with other thermoplastic resins, photoinitiators, photosensitizers, and other optional constituents, is applied to a support for backing member in any manner such as spraying, whirler coating, and the like after which the solvent is evaporated either by air drying or heating to produce a thin film on the support member. Typically, the support member may comprise any rigid substrate and will be characterized by a surface which is hydrophilic and to which the film or coating of the photoreactive composition will adhere. Glass, paper, resin impregnated or reinforced paper, solid resinous sheets, or metal plates, such as aluminum, zinc, magnesium or copper having a coating providing the desired properties and characteristics may be used as the material of construction in the support member. In addition, the support member may be in plate, sheet or foil form and may be smooth or grained. For example, in the case of an aluminum plate backing member, the surface thereof may be treated with an aqueous alkali metal silicate, silicic acid or equivalent which provides the metal with a hydrophilic surface. Likewise, if desired, the base plate or backing member may be provided with a resinous coating which is adapted to receive the light sensitive coating material. Exemplary of resinous coatings of this type are those fully described in U.S. Pat. Nos. 3,073,723, 3,161,517 and 3,232,738.

It will be appreciated that the precise composition of the photosensitive coating solution will be variable to a considerable extent, with the usual requirement being that there be a sufficient amount of photoreactive materials in the solution to deposit a resultant coating on a backing member which will be able to provide an image area which possesses the desired coating thickness and toughness. In general, solvent solutions containing approximately ½% by weight to 10% by weight of the active photoreactive constituents have been found to be suitable for most purposes, including the production of presensitized lithographic plates. Preferably, the concentration of the alkoxyaromaticglyoxy substituted molecules of the present invention and other thermoplastic resins which may be included therewith will be approximately 2% by weight based on the total weight of the solution. If additional photoinitiators or photosensitizers are used, the concentration thereof will usually range from about 0.1% to 20% by weight based on the weight of the other photoreactive constituents.

After the backing or support member has been coated with a film which includes the photoreactive materials of the present invention, it is dried and can be stored for extended periods of time until ready for use. If desired, heat may be used to insure that the residual solvent is driven off for the purpose of facilitating photoinsolubilization when the lithographic plate is exposed to a controlled actinic light source.

In use, the photosensitive coating is exposed to a controlled actinic light source, preferably a mercury lamp with a strong light output of between 300 and 500 nm. It will be appreciated, however, that a wide range of different light sources may be used, depending upon the particular structure of the photoreactive composition and whether or not additional sensitizer and/or initiators are used in conjunction therewith. The exposure to light is done through a stencil, negative, template or pattern to produce a desired light exposure or image area on the surface of the photoreactive coating. This exposure results in a photo-insolubilization within the coating at those locations which receive the light. The duration of exposure is, of course, widely variable depending upon the intensity and type of the light source, the precise composition of the coating, the thickness of the film, and the like. The unexposed areas remain soluble, thereby enabling the image to be solvent developable. In instances wherein water soluble photoreactive compositions are employed, the non-exposed areas can be washed away with a suitable water or alcohol based solvent. The plate can then be desensitized in accordance with known techniques.

The exposed lithographic plate, if desired, may be developed through the use of any emulsion developer of the type well known in the art which causes the exposed surface underlying the light exposed photoreactive coating areas to be hydrophilic and the light exposed photo-insolubilized areas to become oleophilic in a single operation. Such developers eliminate the necessity of subsequently desensitizing the plate after development.

While not necessary, if desired, the coated plate may then be subjected to baking to increase further the strength of the insoluble polymeric image area. For example, the coating composition and support member may be oven baked at a temperature below the softening temperature of the support member, for example, below about 100°C. when an aluminum plate is used as the backing member.

It should be noted that while the foregoing description of a specific application of the materials of the present invention has been directed to the manufacture of lithographic plates, these novel compositions may be likewise advantageously used in other photochemical and photomechanical processes such as, for example, other printing processes, the preparation of etched electrical circuits, chemical milling and the like as well as in the preparation of photocurable inks and coatings which, for example, can be of a decorative or protective nature.

A preferred method for preparing the photoreactive compounds of the present invention involves the glyoxylation of aromatic groups in compounds having two or more alkoxyaromatic groups per molecule. Preferably this glyoxylation involves the Friedel-Crafts glyoxylation of substantially all the aromatic groups in embodiments having a monomeric or oligomeric backbone structure by reaction of ethyl oxalyl chloride in the presence of an anhydrous aluminum trichloride catalyst. In embodiments having a polymeric backbone structure which typically will include from 5 to 10,000 repeating monomeric units, the degree of glyoxylation need not be complete. For example, continuing the glyoxylation until from 20 to 80% of the aromatic groups present in the backbone structure are glyoxylated provides compositions which are eminently satisfactory.

The following examples are set forth for illustrative purposes and describe the preparation of a non-polymeric tetraalkoxy aromatic compound (Example 1), a polymeric alkoxy aromatic material (Example 2). These compounds are glyoxylated to produce polyalkoxyaromaticglyoxy compounds in accordance with the present invention. The remaining examples illustrate the use of these compounds in a variety of applications.

In Example 1, phenyl glycidyl ether is coupled with phenol in the presence of powdered potassium hydroxide to produce glycerol-1,3-diphenylether (GDE). The product is esterified using terephthaloyl chloride in the presence of a triethylamine catalyst to produce bis(1,3-diphenylglyceryl) terephthalate. The latter is a tetralkoxyphenyl compound which is readily glyoxylated with ethyl oxalyl chloride to produce the corresponding monomeric tetraglyoxylate derivative in accordance with the present invention.

In the second example, the GDE is reacted with phenyl glycidyl ether in the presence of powdered potassium hydroxide catalyst to produce a polymeric material which can be regarded as polyethylene oxide polymeric backbone having methoxyphenyl groups pendant from the ethoxy units. The alkoxyphenyl groups were glyoxylated using ethyl oxalyl chloride in the presence of anhydrous aluminum trichloride catalyst to produce the poly (p-glyoxy phenylglycidyl ether) compounds of the present invention.

In the following examples, all temperatures are expressed in degrees Centigrade and, unless otherwise indicated, all percents (%) are expressed by weight based on the weight of the composition referred to.

EXAMPLE 1

Part 1 - Preparation of Glycerol-1,3-Diphenylether

Phenyl glycidyl ether (151 grams or 1 mol), phenol (97.5 grams of 1.03 mol), and powdered potassium hydroxide (0.6 grams or about 0.2% of the total charge), were combined in a flask equipped with a condenser, thermometer, stirrer and nitrogen inlet. A slow flow of nitrogen gas was maintained over the reaction mixture throughout the reaction. The mixture was heated slowly to 110° to 130°C. and held there for 2 hours. It was further heated to 150°C. for 1½ hours to complete the reaction. The reaction mixture was cooled to about 60°, poured into a large tray whereupon it crystallized rapidly. The product was ground up and slurried into water and filtered, washed with dilute sodium hydroxide to remove excess phenol and washed with several liter portions of water to give the crude product. The crude product was recrystallized from a liter of 80% alcohol and water to give 208 grams or 85% yield of purified crystals melting at 81–83.5° C.

Part 2 - Preparation of Bis(1,3-Diphenylglyceryl) Terephthalate

To a flask equipped with a stirrer, thermometer, condenser and addition funnel and containing 175 milliliters of benzene is added glycerol 1,3 diphenyl ether (75.7 grams or .31 mols) and triethylamine (36.4 grams or .36 mols). Terephthaloyl chloride (30.5 grams or .15 mols) is slurried in 125 milliliters of benzene and is placed in the addition funnel. The reaction flask is cooled and the addition of the terephthaloyl chloride is made rapidly holding the temperature below 15°C. When the addition is complete, the mixture is heated to reflux temperature for 1½ hours and is then allowed to cool. The reaction mixture is then evaporated to dryness under vacuum The resulting solid mass is then slurried in water, washed with aqueous sodium carbonate, water, 20% alcohol in water. Yield of crude product was 67 grams. This material was purified by dissolving it in about 300 milliliters of hot toluene and then pouring the hot solution with vigorous stirring into 1,000 milliliters of hexane. The product was then filtered off. The yield was 60.8 grams of 66% of the theoretical. The melting point was 142.5–144.5.

Part 3 - Preparation of Bis[1,3-Di(p-glyoxyphenyl)glyceryl] Terephthalate

In a flask with a dryer protected condenser, gas outlet, sealed stirrer, thermometer and addition funnel is placed 90 milliliters of dry nitrobenzene. The flask is cooled and aluminum chloride (36 grams of 0.27 mols) is added and it is stirred until it dissolves. The ethyl oxalyl chloride (25 grams or 0.18 mols) is added. 27.8 grams or 0.045 mols of bis(1,3-diphenylglyceryl) terephthalate is dissolved in 90 milliliters of dry nitrobenzene and placed in the addition funnel. The apparatus is briefly flushed with dry nitrogen gas. The addition of the substrate to the flask is then begun maintaining the reaction temperature at 0° to 10°C. When about half of the substrate had been added to the reaction flask, the reaction mixture thickened up significantly. Additional solvent seemed only to swell the reaction mass so no more substrate was added. The reaction mixture was allowed to warm to 30° and stirring was continued the remainder of the day. The next day the reaction mixture was dug out of the reaction flask and poured into a mixture of ice and dilute hydrochloric acid to hydrolyze the reaction product. The hydrolyzed reaction mixture was then steam distilled to remove the nitrobenzene solvent. The suspended residue remaining after the steam distillation was dissolved in ethyl acetate. The ethyl acetate was separated from the aqueous phase in a separatory funnel and the aqueous phase was washed with several more portions of ethyl acetate. The product is now in the ethyl acetate solution leaving many of the impurities and salts from the reaction mixture behind. The ethyl acetate solution was then extracted with several portions of nearly saturated sodium bicarbonate solution. The product is now converted into its sodium salt form and dissolves in the aqueous phase. Then more ethyl acetate is added to the aqueous phase and the solution is acidified to pH of 1. Upon acidification, the product is converted to its acid form and redissolved in the ethyl acetate layer. The ethyl acetate layer was dried with anhydrous sodium sulfate to remove water and then evaporated down to about 150 milliiters and was poured into several volumes of hexane to precipitate the product. The product was filtered off and dried. The yield was 10.8 grams.

EXAMPLE 2

Part 1 - Preparation of Poly(phenylglycidylether)

In a resin kettle equipped with condenser, stirrer, nitrogen inlet is placed 200 milliliters of xylene, glycerol-1,3-diphenyl ether (14.7 grams or 0.06 mols, prepared as in Example 1), phenylglycidylether (270.4 grams or 1.8 mols), and powdered potassium hydroxide (0.65 grams or about 0.2% of the total charge). A slight flow of nitrogen is maintained during the entire reaction. The mixture is heated rapidly to about 110° to 120° and held there for several hours and then heated up to the reflux temperature or about 145°C. Then the condenser is reversed and the xylene is distilled off of the reaction mixture. The remaining reaction mixture is heated slowly to 160°C. with continued nitrogen flow and vacuum is applied to remove any excess phenylglycidyl ether remaining behind in the polymer. The reaction mixture is cooled and poured into a jar. The yield of polymer is nearly quantitative. The polymer is used without further purification. This polymer has a theoretical degree of polymerization of about 30 since an excess of 30 mols of phenylglycidylether was used over that of the glycerol-1,3-diphenyl ether.

Part 2 - Preparation of Poly(p-glyoxy phenylglycidylether)

In a resin kettle equipped with a motor driven stirrer, nitrogen inlet, condenser and gas outlet, 250 milliliter addition funnel and thermometer, is placed 300 milliliters of dry nitrobenzene and 26.6 grams or 0.18 equivalents of poly(phenylglycidylether). The apparatus is flushed with nitrogen gas and the reaction vessel is cooled with ice and 25 grams or 0.18 mols of ethyl oxalyl chloride is added. In the addition funnel is placed a solution of 39 grams or 0.29 mols of anhydrous aluminum chloride dissolved in about 120 milliliters of nitrobenzene. The flow of dry nitrogen gas is maintained throughout the reaction. The reaction kettle is then cooled down to 0° to 5°C. and the addition of the aluminum chloride solution is started. The solution is added over a period of about 20 minutes with continued stirring. After completion of the addition of the aluminum chloride solution, the reaction mixture is allowed to warm slowly to room temperature. Shortly after the addition is complete, the mixture thickens up to a soft gel but stirring is maintained for the remainder of the day and is then discontinued overnight. The following day the gel-like reaction mixture is dropped in small portions into a mixture of ice and dilute hydrochloric acid with vigorous stirring. The resulting solution is then steam distilled to remove all the nitrobenzene. Ethyl acetate is then added to the warm solution remaining after the steam distillation to dissolve the suspended polymer. When the polymer is completely dissolved, the solution is then placed in a separatory funnel and the two layers are separated. The aqueous layer is then extracted with two more portions of ethyl acetate. The combined ethyl acetate extracts were dried over anhydrous sodium sulfate, the aqueous layer was then discarded. The ethyl acetate is filtered to remove the sodium sulfate drying agent and then a solution of 80% saturated sodium bicarbonate is added and these are stirred together vigorously. The solution is poured into a separatory funnel and the aqueous layer separated from the ethyl acetate layer. The ethyl acetate layer is then washed with two more portions of sodium bicarbonate solution. The combined sodium bicarbonate solutions are then vacuum evaporated to remove all the ethyl acetate. The aqueous solution is then cooled with ice and hydrochloric acid is added in sufficient quantity to bring the pH to 1 thus precipitating the polymer from the aqueous solution. The polymer is filtered off, washed repeatedly with deionized water and dried. The yield of polymer was 27.4 grams having a neutralization equivalent of 294. From this it can be calculated that the percent of glyoxylation was 67% and the yield of polymer from the reaction was 78% of the theoretical.

EXAMPLE 3

Solutions A, B and C, respectively, were prepared by admixing ingredients as set forth in Table I.

TABLE I

| | Styrene Monomer | Methanol | PGEPGA |
|---|---|---|---|
| Solution A | 2 gr. | 2 gr. | None |
| Solution B | 2 gr. | 2 gr. | 0.2 milligrams |
| Solution C | None | 4 gr. | 0.2 milligrams |

As used here, PGEPGA denotes poly(p-glyoxy phenylglycidylether), the light sensitive polymer prepared in Example 2.

Nitrogen gas was bubbled through these three solutions and then they were irradiated for twenty minutes with a black light fluorescent lamp. Only in solution B did any precipitate, indicating polymerization of styrene, become evident.

EXAMPLE 4

Solutions D, E and F, respectively, were prepared by admixing ingredients as set forth in Table II.

TABLE II

| | Styrene Monomer | Methanol | PGEPGA |
|---|---|---|---|
| Solution D | 1 gr. | 2 gr. | None |
| Solution E | 1 gr. | 2 gr. | 0.1 gr. |
| Solution F | None | 3 gr. | 0.1 grr. |

Solutions D and E were irradiated as in Example 3 for 150 minutes. In Solution D there was no indication of any formation of polystyrene. In Solution E precipitate formed was collected and analyzed and found to be essentially polystyrene. Solution F was irradiated without nitrogen flushing and a yellow precipitate formed. Since no styrene was present, only the photopolymer was crosslinked in this case.

EXAMPLE 5

One gram of polymer prepared in Example 2 was dissolved in 25 grams of acetone and 24 grams of methylethyl ketone to make a coating solution. This solution was flow coated on a brushed grain aluminum plate previously treated to render the surface hydrophilic and was allowed to drain and dry at room temperature, then for several minutes in a warm oven. The resulting plate was then exposed for 8 minutes on a Nuarc FT 40 Flip-Top Platemaker with a pulsed xenon light source having 4,000 watts input power to the lamp through a negative. The exposed plate was then developed merely by swabbing it with a standard lithographic desensitizer and then gumming it with a standard gum asphaltum etch. The plate was then mounted on a printing press. Plate exposure was such that 7 solid steps printed on a lithographic sensitivity guide. Printing was continued until the first evidence of image wear which occurred on a 300 line 20% screen after 38,000 impressions.

EXAMPLE 6

One gram of the polymer of Example 1 was dissolved in 50 grams of acetone to make a coating solution. A plate was then prepared as given in Example 5 except that the plate was exposed for 10 minutes. This plate ran on lithographic press 25,000 copies before showing any evidence of image wear.

EXAMPLE 7

A coating solution was prepared by dissolving 0.33 grams of PGEPGA, the polymer of Example 2, three grams of a high molecular weight polymethylmethacrylate resin, 29 grams of 2-ethoxyethyl acetate, 29 grams xylene, 39 grams of acetone. Using this as a coating solution, a lithographic plate was prepared as given in Example 5. This plate was exposed for 8 minutes and was developed with a developer composed of 70 parts by volume of standard lithographic desensitizer, 29 parts by volume of 2 ethoxyethyl acetate, and 1 part by volume of an emulsifying agent. The resulting plate ran for 10,000 impressions on the printing press before showing any signs of wear.

EXAMPLE 8

A coating solution was prepared by dissolving 6 grams of a high molecular weight polymethylmethacrylate resin and 4 grams of PGEPGA, the polymer of Example 2, in 57 grams of 2 ethoxyethyl acetate, 57 grams of xylene and 76 grams of acetone. A lithographic plate was prepared from this coating composition by the same procedure as given in Example 5. The plate was exposed as before for 8 minutes and developed with the same developing composition as was given in Example 7. This plate ran over 37,000 impressions on the press before showing any signs of wear.

EXAMPLE 9

An unsaturated polyester resin was prepared by standard polycondensation techniques from 2 parts of maleic anhydride; one part phthalic anhydride and 3 parts of 1,2-propanediol. A coating solution was prepared containing 6 grams of this polyester resin, 4 grams of the polymer of Example 2, and 57 grams of acetone. From this coating composition a lithographic plate ws prepared and exposed as given in Example 5. After exposure the plate was developed with an emulsion developer composed of, in parts by volume, 69 parts of lithographic desensitizer, 30 parts of 2-ethoxyethyl acetate and 1 part of an emulsifying agent. This plate was run on a lithographic press concurrently with the plates of Examples 5 and 6 and run over 36,000 impressions before image failure showed up on a 300 line, 20% dot screen.

EXAMPLE 10

A small quantity of the polymer of Example 2 was slurried in water. Dilute sodium hydroxide was added to adjust the pH to 7 to form the sodium salts of the acidic polymer. Water was then added to adjust the polymer concentration to about 5%. This solution was coated on a brushed grained aluminum plate as described in Example 5. The plate was exposed to the light from two 15 watt black light fluorescent lamps at 2 inches for about 30 minutes. The resulting hardened film could not be removed by vigorous rubbing with water, ethyl alcohol or acetone. The second plate was coated with a 2% acetone solution of the polymer of Example 2. The resulting coated plate was exposed to an ammonia vapor for about 5 minutes to convert the acidic polymer to its ammonium salt. The plate was exposed as above and found to be similarly resistant to solvent.

EXAMPLE 11

A printed circuit is prepared as follows: 5% solution of the polymer of Example 2 in acetone was coated on the copper clad side of a copper clad phenolic laminate board having a 1.4 mil thickness of copper. The coated board was exposed for 8 minutes to the exposure device described in Example 5 through a suitable photographic negative. The exposed board was then developed with 5% aqueous sodium bicarbonate solution to remove the polymer which had not been light hardened. The bare copper that was then exposed by the development process was etched away in a 40% aqueous ferric chloride solution in 18 minutes to produce an excellent replica of the original photographic negative. The etching resist was removed from the remaining copper by swabbing the board with a dilute solution of sodium silicate, having a pH of about 11.

EXAMPLE 12

This example illustrates the use of the polymer of Example 2 as a metal protective coating.

Part A

An aluminum lithographic plate was coated with a solution consisting of 3 grams of a high molecular weight polymethylmethacrylate homopolymer, 2 grams of the polymer of Example 2, and 55 grams of acetone. Two 3 by 5 inch sections were cut from this plate after it was coated and weighed on an analytical balance. One of the plates was exposed for 30 minutes to the light from two 15 watt black light fluorescent lamps. The exposed plate was immersed for two and a half hours in warm acetone, dried and reweighed and found to have lost only 4 milligrams of its total coating weight. From the unexposed sample, it was determined that the total coating weight of 3 by 5 inch plate was 89 milligrams. Therefore, only about 5% weight loss was sustained on the exposed plate.

Part B

A piece of brass sheet was partially coated with a 2% solution of the polymer of Example 2 and exposed 8 minutes to the xenon arc described in Example 5. This coating protected brass from any etching by concentrated hydrochloric acid for 20 minutes, whereas the uncoated area of the brass plate was etched. This protective coating also prevented brass from being etched by 40% ferric chloride for 3 minutes whereas the uncoated area was quickly discolored. Similarly, an exposed coating of a 10% solution of the polymer of Example 2 on the brass completely protected brass from any etching during a 15 minute exposure to 40% ferric chloride. The coating also protected the brass from attack by 10% nitric acid for about 15 minutes.

Part C

A steel coupon partially coated with both 2% and 10% solutions of the polymer of Example 2 and the resulting coated and exposed plate was partially immersed in a vigorously stirred hot salt solution for an hour. The uncoated area was significantly attacked by the salt solution but the coated areas were not attacked.

Part D

A 2% solution of the polymer of Example 2 was coated on a piece of aluminum sheet metal. This coating after exposure substantially protected the aluminium from etching by a composition composed of 5 grams of ferric chloride, 5 grams of cuprous chloride, 25 grams of concentrated hydrochloric acid, 75 grams of ethyl alcohol and 90 grams of water. This coating also forms a satisfactory resist type polymer for the etch and copperizing solution commonly used in the deep etch lithographic process.

EXAMPLE 13

A gravure type ink composition was prepared from 0.5 grams of phthalocyanine blue pigment, 0.7 grams nitrocellulose resin, and 0.8 gram of the polymer of Example 2. These were dissolved in 1.7 grams of ethyl alcohol, 0.5 grams of toluene and 2.8 grams of methyl ethyl ketone. The phthalocyanine blue pigment had been previously milled into nitrocellulose resin so no additional milling was necessary to give a good dispersion of pigment. This ink composition was drawn down on a metal plate into a thin film using a wire would coating bar. Two such films were drawn down and one was exposed for 10 minutes on the xenon arc described in Example 5. The exposed sample had much greater solvent resistance to methyl ethyl ketone than the unexposed one. It had complete solvent resistance to ethyl alcohol whereas the unexposed portion of the sample had poor resistance to alcohol.

While in the foregoing specification certain embodiments and examples of this invention have been described in detail, it will be appreciated that modifications and variations therefrom will be apparent to those skilled in this art. Accordingly, this invention is to be limited only by the scope of the appended claims.

We claim:

1. A light sensitive composition comprising a polymeric compound which includes as a recurring structure:

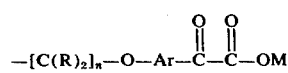

wherein R is selected from the group consisting of H, aryl, alkyl, halo and aralkyl having up to 10 carbon atoms and n is an integer from 1 to 18, Ar is an aromatic substituent and M is selected from the class consisting of H, alkali metal, ammonium and substituted ammonium.

2. The composition of claim 1 wherein said recurring structure is present in said polymer as pendant groups from the polymeric chain.

3. The composition of claim 1 wherein R is H.

4. The composition of claim 1 wherein n is an integer from 1 to 10.

5. The composition of claim 1 wherein Ar is phenyl.

6. The composition of claim 1 wherein M is H.

7. The composition of claim 1 wherein R is H, Ar is phenyl and M is H.

8. The composition of claim 2 wherein said polymeric chain includes as a recurring structure —$CH_2$—$CH$—$O$—.

9. The composition of claim 1 wherein said polymeric compound is poly(p-glyoxy phenylglycidyl ether).

10. A light sensitive composition comprising a polymer having two or more alkoxyaromaticglyoxy substituents of the following formula per molecule:

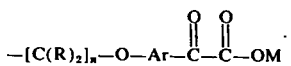

wherein R is selected from the group consisting of H, aryl, alkyl, halo, and aralkyl having up to 10 carbons and n is an integer from 1 to 18, Ar is an aromatic substituent and M is selected from the class consisting of H, alkali metal, ammonium, and substituted ammonium, said substituents being attached to a backbone structure having between 5 and 10,000 repeating units.

11. The composition of claim 10 in which said compound includes recurring units comprising substituents having the formula:

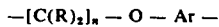

wherein all the letters and numbers are defined in claim 10, and wherein at least 10% of the Ar groups are glyoxylated.

12. The composition of claim 11 wherein the alkoxyaromaticglyoxy substituents are attached to a backbone structure selected from the group consisting of aliphatic, aromatic, substituted aromatic, heterocyclic, metallocene, polyalkylene, polyalkylene oxide, polyester, polyurethane, polyamide, polysiloxane, polyalkylene imine, substituted polyalkylene, and phenolic derivatives.

13. The composition of claim 11 which contains an effective amount of said alkoxyaromaticglyoxy substituted compound together with a solvent selected from the group consisting of water and organic solvents.

14. The composition of claim 13 in which said effective amount is an amount sufficient to provide a concentration of said alkoxyaromaticglyoxy substituted compound in the range of 0.5 to 10% by weight based on the combined weight of the compound and solvent.

15. The composition of claim 10 wherein an effective amount of said alkoxyaromaticglyoxy substituted compound is dispersed in a solvent together with a material selected from the group consisting of saturated resins, unsaturated resins and polymer precursors which material combines with said alkoxyaromaticglyoxy substituted compound to form a photoinsolubilized product.

16. The composition of claim 15 wherein said material is dispersible in said solvent and is selected from the group consisting of acrylic polymers, acrylic ester resins, copolymers of methyl and butyl methacrylate, polyurethane resins, alkyl celluloses, epoxy resins, phenoxy resins, vinyl acetate/vinyl chloride copolymers, vinyl modified polyethylene, partially hydrolyzed vinyl acetate resin, phenolic resins, acrylamide and modified acrylamide polymers, water-soluble cellulose derivatives, and water-soluble polyether resins.

17. The composition of claim 15 in which the alkoxyaromaticglyoxy substituted compound is present in an amount of at least 5% by weight based on the weight of the reactive material in the composition.

18. The composition of claim 10 wherein said alkoxyaromaticglyoxy substituted compound is present with a polymerizable monomer, the amount of said alkoxyaromaticglyoxy substituted compound ranging from approximately 0.01% to 10% by weight, based on the total weight of reactive material in the composition.

* * * * *